United States Patent [19]

Motsch

[11] 4,373,259
[45] Feb. 15, 1983

[54] PROCESS FOR MOUNTING COMPONENTS WITH SURFACE JUNCTIONS TO PRINTED-CIRCUIT BOARDS

[75] Inventor: Hans Motsch, Geislingen, Fed. Rep. of Germany

[73] Assignee: Württembergishche Metallwarenfabrik, Geislingen, Fed. Rep. of Germany

[21] Appl. No.: 100,354

[22] Filed: Dec. 5, 1979

[30] Foreign Application Priority Data

Dec. 6, 1978 [DE] Fed. Rep. of Germany ....... 2852753

[51] Int. Cl.³ .............................................. H05K 3/34
[52] U.S. Cl. .................................. 29/840; 228/180 R; 228/180 A
[58] Field of Search ................. 29/832, 837, 840, 460, 29/760; 228/180 R, 180 A, 258, 179, 240, 243

[56] References Cited

U.S. PATENT DOCUMENTS

| | | | |
|---|---|---|---|
| 2,756,485 | 7/1956 | Abramson et al. | 29/460 X |
| 3,294,951 | 12/1966 | Olson | 228/179 X |
| 3,302,067 | 1/1967 | Jackson et al. | |
| 3,355,078 | 11/1967 | Smith . | |
| 3,387,365 | 6/1968 | Stelmak | 228/180 A X |
| 3,393,449 | 7/1968 | Garcia | 228/179 X |
| 3,445,919 | 5/1969 | Saba | 228/179 |
| 3,516,155 | 6/1970 | Smith . | |
| 3,540,718 | 11/1970 | Heffron | 29/760 X |
| 3,673,680 | 7/1972 | Tanaka et al. | 29/837 |
| 3,690,943 | 9/1972 | Papiano . | |
| 3,762,040 | 10/1973 | Burns et al. | 228/243 X |
| 3,982,979 | 9/1976 | Hentz et al. | 29/760 X |
| 4,184,623 | 1/1980 | Strasser | 228/180 A |

FOREIGN PATENT DOCUMENTS

| | | |
|---|---|---|
| 1065898 | 9/1959 | Fed. Rep. of Germany . |
| 1089437 | 9/1960 | Fed. Rep. of Germany . |
| 2633269 | 8/1977 | Fed. Rep. of Germany . |

*Primary Examiner*—Carl E. Hall
*Assistant Examiner*—Carl J. Arbes
*Attorney, Agent, or Firm*—Finnegan, Henderson, Farabow, Garrett & Dunner

[57] ABSTRACT

A process for connecting flat, film-like components to a printed circuit board includes providing the printed circuit board with through-plated holes whose plating includes a fusible material and extends to contacts on the printed circuit board, positioning the flat, film-like components on the board so that the junctions of the components touch but do not extend into the holes and contacting the printed circuit board on the side opposite to the side with the components with liquid solder which rises in the holes, heats the plating and the junctions and bonds the components to the printed circuit board.

15 Claims, 5 Drawing Figures

PROCESS FOR MOUNTING COMPONENTS WITH SURFACE JUNCTIONS TO PRINTED-CIRCUIT BOARDS

The present invention relates to a process for mounting components with surface junctions, in particular flat, film-shaped components, to printed-circuit boards, wherein the junctions are connected by soldering to the printed-circuit board. The invention furthermore relates to a template which is advantageously applied in the implementation of this process.

In a known process of the above kind, the components are soldered to the printed-circuit board by means of a soldering frame. The components are deposited individually by means of suction tweezers in the required position on the printed-circuit board, and the contact points are soldered using the soldering frame. The heat is applied by means of the soldering frame from the top through the components to the junction sites of the components and of the printed-circuit board. Even in the case of machine-production, this process is time-intensive because the individual components must be individually and sequentially deposited and soldered.

It is furthermore known to control the temperature at the surface of a printed-circuit board by means of a heating plate or radiators in such manner that the soldering temperature is achieved at the desired connection sites of the conductors on the printed-circuit board and the surface junctions of the components.

Generally the printed-circuit boards also comprise additional components provided with connector pins which are soldered on the reverse side of the printed-circuit board in a soldering bath. The drawback here consists of twice heating the printed-circuit board, which can degrade the reliability of the soldering and requires an additional operational step. Electronic components as a rule are very temperature-sensitive. Soldering operations must therefore absolutely avoid exceeding critical temperature limits of the components, in order to preclude damage to these parts. When using soldering baths, therefore, a specific time of contact with the liquid solder may not be exceeded. Surface-shaped components accordingly require precautions when being soldered in a soldering bath together with components comprising connector-pins, because it may happen that insufficient heat will be applied during the maximally admissible time of contact with the liquid solder through the printed-circuit board to melt the junction sites of surface components.

It is the object of the invention to provide a process for affixing components to printed circuit boards which is more reliable and less labor-intensive than the known processes.

This problem is solved by teh present invention in that the printed-circuit board comprises through-plated holes in the region of the junction sites and in that the heat to melt the solder layers present at the matching positions of the components and the printed-circuit board is delivered from that side of the printed-circuit board which is opposite the components through the through-plates holes by means of liquid solder.

This process offers the feasibility to mount a plurality of components with surface junctions to the printed-circuit board in one operational step. The time saving so achieved is considerable. A further advantage of this process is that no expensive apparatus is required in machine operation.

The process is especially advantageous when flat, film-shaped components are soldered simultaneously with components comprising connection pins projecting through holes in the printed-circuit board. In most cases, components with connection pins will have to be mounted to the printed-circuit board in addition to the components with flat junctions. The process of the invention requires only a single soldering operation to solder the individual components having different junction contacts. The contacts with the liquid solder in the soldering bath do not require alteration, so that damage to components by passing over will not occur.

A high degree of reliability is further obtained in that the components are placed against the printed-circuit board prior to the soldering operation by means of a template, and in that following termination of the soldering procedure, the template is again removed. By using a special template, it is ensured that the components to be mounted are properly positioned and that the flat junctions lie flat on the surface of the printed-circuit board, whereby it is ensured that the solder rising in the holes heats the junction contacts and melts them. When several flat components are mounted to a printed-circuit board in a predetermined arrangement, preferably a single template will be used for several components so these will be simultaneously placed or pressed against the surface of the printed-circuit board.

A template for mounting flat components, especially film components, to printed-circuit boards on which the components are to be soldered, is characterized by the invention in that pressing elements are provided in the template where the component junctions are located. The individual junctions are pressed in controlled manner against the surface of the printed-circuit board, whereby a high degree of reliability is achieved. In an especially advantageous embodiment of the template of the invention, the pressing elements are designed as weights displaceable within guides. Such a template can easily be made, and the weights can easily be fitted to the flat components to be mounted. The pressing force everywhere is independent of the particular height of the components, whereby a uniform pressure is achieved on all spots to be soldered. A plurality of film components can be received in one template.

An illustrative embodiment of the invention is discussed below in further detail in relation to the drawing.

Figure 2:
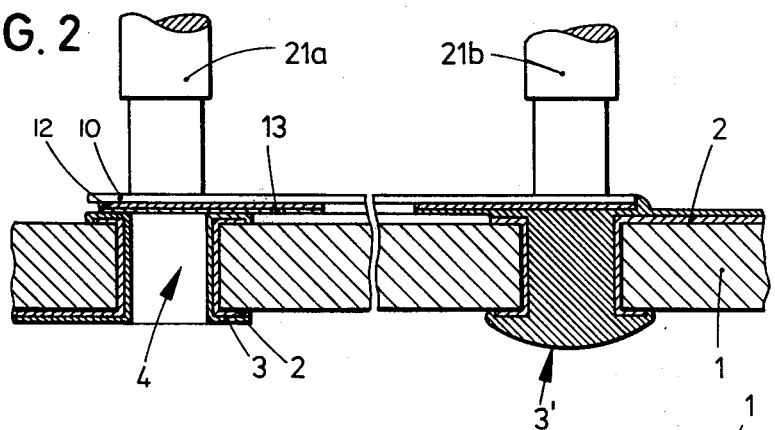
FIG. 2 is a cross-section of the arrangement of FIG. 1 along the line II—II, with the left contact site unsoldered and the right contact side soldered.
Figure 1:
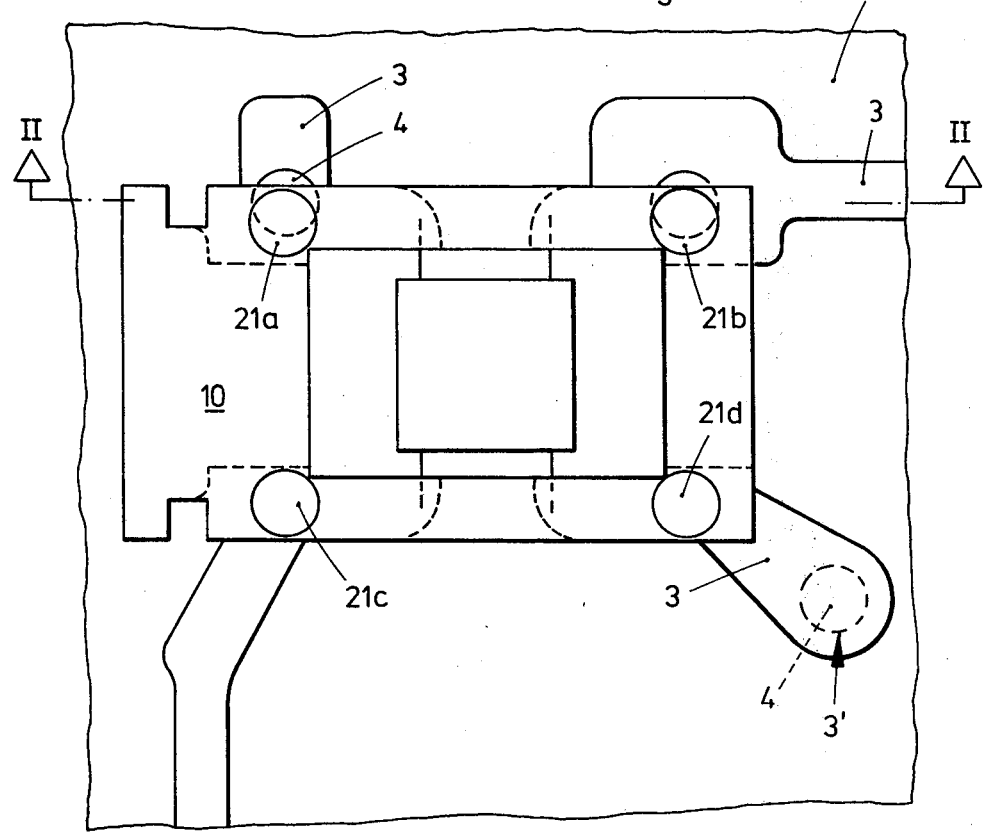
FIG. 1 is a partial top-view of a printed-circuit board with a component to be mounted thereon.

FIG. 1 shows a partial view of a printed-circuit board 1. The printed-circuit board 1 is provided with several holes 4 through-plated by a copper layer 2 and a tin layer 3, as shown in FIG. 2. The copper layer 2 and the tin layer 3 extend partly on the surfaces of the printed-circuit board 1.

A Hall-IC containing a Hall generator is positioned on the printed-circuit board 1 and is kept in place by a film plate 10 made of Kapton. As shown by FIG. 2, the component 10 comprises several surface junctions, each consisting of a copper (Cu) layer 12 and a lead-tin (PbSn) layer 13.

Figure 6:
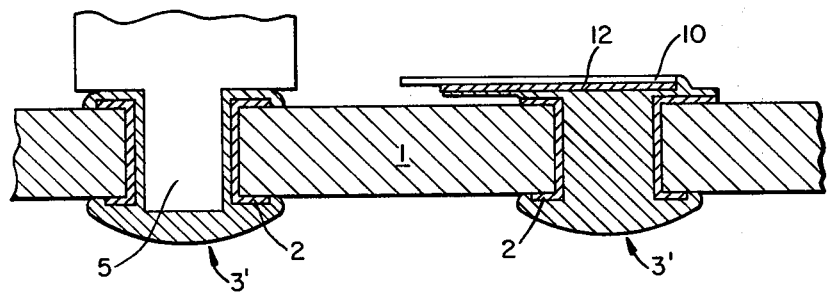
FIG. 6 is a cross-sectional view of a printed circuit board with a film-shaped component as well as a component having a junction pin soldered thereto.

In order to mount component 10 to the printed-circuit board 1, first the holes 4 with the through-plating will be made. This operation takes place appropriately simultaneously with the drilling and through-plating for the other components to be mounted on the printed-circuit board 1 and provided with connection pins 5, which are plugged into the holes, so that they project from the holes on the other side of the printed-circuit board, as shown in FIG. 6. Thereupon the components 10 are positioned into place on the printed-circuit board 1. Preferably this is carried out by means of a template which will be discussed further below, into which, or on which the components 10 are placed with the junction contacts upward. The template then is fastened to the printed-circuit board, for instance by screwing, so that the components 10 with junctions 12,13 are properly positioned. As already clear from FIGS. 1 and 2, the template comprises weights 21a through 21d, which press against the film plate at the sites of the junction contacts so that these rest flatly on the surface of the printed circuit board. This condition is illustrated on the left-hand side of FIG. 2.

In a further operation, the printed-circuit board is pulled by the lower side through a soldering bath whereby the liquid solder rises in holes 4 and fuses with the tine layer of the through-plating and the lead-tin layer of the film plate 10. In this manner a soldering site is obtained, shown schematically. In FIG. 6 and in the right-hand side of FIG. 2 and denoted by reference 3'. In the last step of the operation, the remaining components with connection pins 5 are also soldered on the printed-circuit board. This is shown in FIG. 6, wherein the right-most portion shows a solder site obtained at the location of a flat junction, while the leftmost portion illustrates pin connector 5 soldered to the circuit board.

As shown at the right-lower portion of FIG. 1, the junction contact of component 10 need not be positioned directly above the corresponding hole 4 in the printed-circuit board. There may be a spacing between the contact and the hole. In this position too the solder rising in bore 4 provides enough heat to the tin layer 3 on the upper side of the board that in this case also there will be good soldering. In other words: liquid solder from the solder bath is not required for soldering the junction site. Rather, the heat is supplied by the liquid solder through the Cu through-plating and the conductor strip.

Especially advantageous results are obtained if the bores 4 have diameters between 0.3 and 1.6 mm for the described process.

Figure 3:
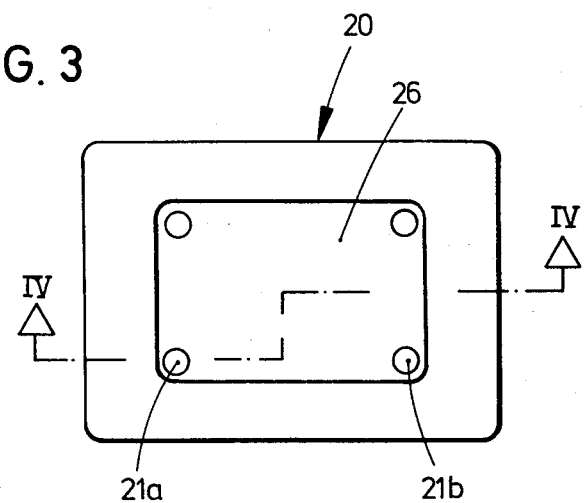
FIG. 3 is a bottom view from below of a template used for pressing a component against the surface of a printed-circuit board.
Figure 4:
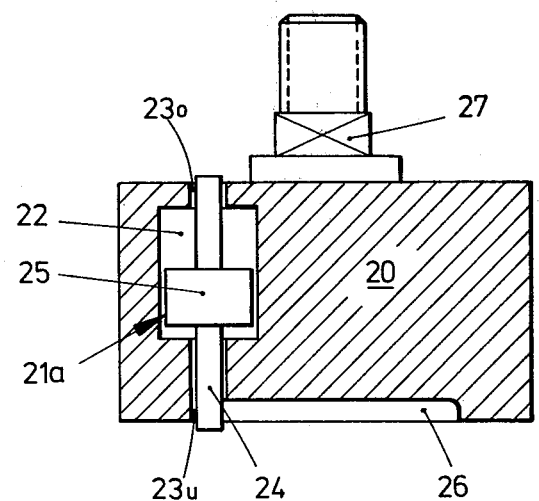
FIG. 4 is a cross-section along line IV—IV of FIG. 3.

FIG. 3 is a bottom view of a template 20 for receiving a single flat component, for instance the component 10 of FIG. 1. Four pressing elements 21a through 21d are displaceably mounted in template 20. As shown by FIG. 4, a chamber 22 for each pressing element 21 is provided in the template housing. The pressing element 21a consists of a pin 24 and a weight 25. The weight 25 is located in chamber 22 and the two ends of pin 24 project upwardly and downwardly through openings 23o and 23u, respectively. The lower opening 23u issues into a recess 26. This recess 26 houses one component. The template 20 furthermore comprises a fastening means 27 permitting the sequential attaching of several templates 20.

In order to mount for instance component 10, the template is so placed that the recess 26 points upward, and a component 10 is so placed into the recess 26 with the surface junctions 12,13 pointing upward (that is, downward in FIG. 4). Thereupon the printed-circuit board 1 is placed on the template and fastened, for instance by means of screws. When the printed-circuit board is pulled through a solder bath by the side opposite the components, the pressing elements 21 in the chambers drop and press the component 10 against the surface of the printed-circuit board, the pins 24 acting where the junction contacts are located in the component 10. It is seen that the pressing force is about the same everywhere in the component 10, independently of the "height" of the component at the particular location.

The invention is not restricted to the embodiment shown. In principle all components with surface junctions can be soldered to a printed-circuit board by the process of the invention. Obviously the template—which preferably is made of plastic—can be designed for several components, whereby a whole set of components can be simultaneously deposited on the printed-circuit board. Even though not shown in the drawing, it should be clear to the expert that the template may comprise bores or pins by means of which the template can be screwed or clamped to the printed-circuit board, so as to permit quick removal following the soldering process. Again the pressing elements can be designed as pins in lieu of the weights displaceable within the guides, said pins being pressed individually or in common by spring elements. Within the scope of the conception of the invention, in lieu of the displaceable pins, other suitable means can also be used, such as temperature-resistant elastomers, which press against the film components at particular points or on the entire surface thereof. Such templates additionally may comprise known holding means of the suction, adhesive or similar type, for holding surface components.

Figure 5:
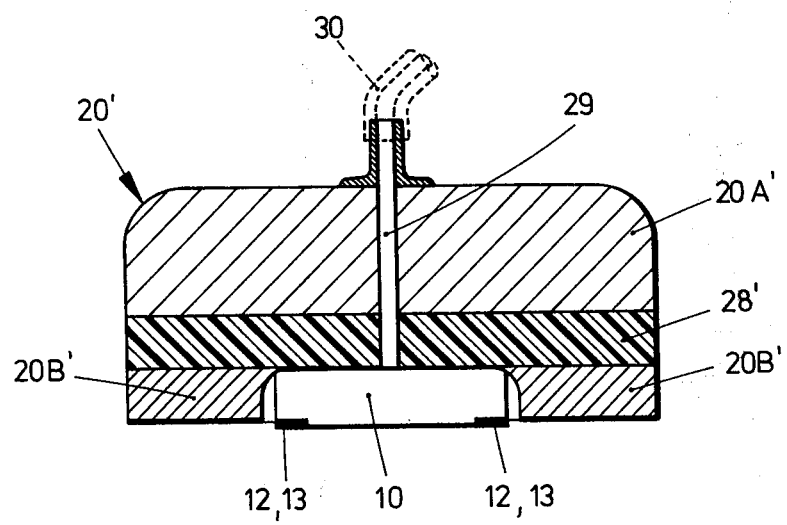
FIG. 5 is a cross-section of a further embodiment of a template in accordance with the present invention.

FIG. 5 shows an embodiment of such a template 20' with an outer template body 20A', an elastomeric pressing layer 28' and a positioning element 20B' surrounding a film component 10 having junctions 12,13. The film component, following its positioning in the template, is kept in place by a vacuum generated through bore 29 and the suction line 30. When pressing the film component against the printed-circuit board, the layer 28' will be compressed. In specific applications, the templates may also remain on the printed-circuit board after the components have been mounted.

I claim:
1. A process for connecting flat film-like components to a printed circuit board, wherein said components include electrically-conductive junctions, said process comprising the steps of:
  providing said printed circuit board with through-plated holes whose plating includes fusible material and extends to contacts on said printed board, where said junctions are to be placed on said printed circuit board;
  positioning said components on said board with said junctions touching said contacts but not extending into said through-plated holes; and
  contacting said printed circuit board, on a side thereof opposite said components, with liquid solder which rises in said through-plated holes thereby heating the plating therein and said junc- tions to form a bond between said printed circuit board and said components at said contacts.

2. A process as in claim 1, wherein said printed circuit board is passed through a soldering bath, the side of said board opposite said components contacting the solder in said bath.

3. A process as in any one of claims 1 or 2, further comprising the steps of:
  positioning at least one of said film-shaped components on said printed circuit board, said at least one film-shaped component including junctions positioned on a surface of said board adjacent, but not into, said through-plated holes;
  positioning at least one component having connection pins on said printed circuit board with said pins projecting through said through-plated holes in said printed circuit board, and
  simultaneously bonding said at least one film-shaped component and said at least one component having connection pins to said printed circuit board.

4. A process as in any one of claims 1 or 2, further comprising placing at least some of said flat film-like components in template means, positioning said template means against the printed-circuit board prior to bonding said components thereto, whereby said components are accurately positioned on said board.

5. A process as in claim 4, further comprising removing said template after bonding the components to the board.

6. A process as in claim 3, further comprising placing at least some of said components in template means, positioning said template means against the printed-circuit board prior to soldering whereby said components are accurately positioned against said board.

7. A process as in claim 6, further comprising removing said template after bonding the components to the board.

8. A process as in claim 4, wherein said template means comprises retaining means for retaining components in said template means prior to positioning against said circuit board.

9. A process as in claim 6, wherein said template means comprises retaining means for retaining components in said template means prior to positioning against said circuit board.

10. A process as in any one of claims 1 or 2 wherein the diameter of said through-plated holes is about 0.3 to 1.6 mm.

11. A process as in claim 4, further comprising pressing said components against said printed-circuit board by means of said template means during bonding of said components to said board.

12. A process as in claim 6, further comprising pressing said components against said printed-circuit board by means of said template means during bonding of said components to said board.

13. A process as in claim 1, comprising bonding at least some of said junctions to said printed circuit board by contacting solder with the plating on said holes and with corresponding ones of said junctions.

14. A process as in claim 1, comprising contacting at least some of said junctions with portions of the plating of corresponding ones of said through-plated holes, and heating said plating by means of said liquid solder, whereby said plating melts and bonds said junctions to said board.

15. A process as in claim 14, wherein said plating comprises at least a tin layer.

* * * * *